United States Patent [19]

Tsukada et al.

[11] Patent Number: 5,451,721
[45] Date of Patent: Sep. 19, 1995

[54] MULTILAYER PRINTED CIRCUIT BOARD AND METHOD FOR FABRICATING SAME

[75] Inventors: Yutaka Tsukada, Shiga; Shuhei Tsuchida, Kusatsu, both of Japan

[73] Assignee: International Business Machines Corporation, Armonk, N.Y.

[21] Appl. No.: 764,733

[22] Filed: Sep. 24, 1991

[30] Foreign Application Priority Data

Sep. 27, 1990 [JP] Japan .................. 2-255464

[51] Int. Cl.⁶ .................................. H05K 1/00
[52] U.S. Cl. .................................. 174/261; 174/262; 174/265; 174/266; 361/784; 361/792; 361/795
[58] Field of Search .......... 174/262, 264, 265, 266, 174/261; 361/412, 417, 418

[56] References Cited

U.S. PATENT DOCUMENTS 4,673,773 6/1987 Nakano et al. .
4,710,854 12/1987 Yamada et al. .
4,882,454 11/1989 Peterson et al. .
4,904,968 2/1990 Theus .

*Primary Examiner*—Kristine L. Kincaid
*Assistant Examiner*—Cheryl R. Figlin
*Attorney, Agent, or Firm*—Bernard Tiegerman

[57] ABSTRACT

A multilayer printed circuit board and a corresponding fabrication method are disclosed, which circuit board achieves a relatively high degree of wiring density and a relatively high degree of wiring design freedom. These advantages are obtained in the inventive printed circuit board by electrically connecting power conductors or ground conductors using through holes. On the other hand, signal conductors in any two adjacent signal wiring layers are electrically connected using via holes extending only through an intervening electrically insulating layer. Preferably, the electrically insulating layer is a layer of photosensitive resin and the via holes are formed using conventional photolithographic techniques.

16 Claims, 6 Drawing Sheets

MULTILAYER PRINTED CIRCUIT BOARD AND METHOD FOR FABRICATING SAME

BACKGROUND OF THE INVENTION

1. Field of the Invention

The invention pertains to multilayer printed circuit boards and to corresponding fabrication methods.

2. Description of the Related Art

In prior multilayer printed circuit boards, it is common to dispose power supply and ground layers inside and signal layers outside, and to interconnect those layers by through holes. Inasmuch as the through holes are formed by mechanical drilling and hence tend to be of relatively large size, it is difficult to increase the wiring density of the circuit board. Also, inasmuch as it is necessary to design the signal layers on both sides while always taking through hole connections into consideration, freedom in wiring design is relatively restricted. Moreover, because the through holes pass through the power supply and ground layers, it is necessary to provide clearance holes at those through hole locations in the power supply and ground layers where no power supply or ground connections are required. Accordingly, the higher the through hole density becomes, the smaller the clearance holes have to be formed with still higher accuracy, which in turn entails more accurate alignment of the signal layers with the power supply and ground layers in laminating those layers. Recently, in addition to PIH (Pin In Hole) components which are mounted by inserting their pins into through holes, SMT (Surface Mount Technology) components which are mounted without pins have come to be used. Therefore, there is a need for multilayer printed circuit boards which can be applied to both SMT and PIH components, and which can provide higher wiring density and higher degree of freedom in design of wiring.

OBJECTS OF THE INVENTION

The primary objects of the invention are to provide a multilayer printed circuit board, and a corresponding fabrication method, which achieves a significantly higher wiring density and a significantly higher degree of wiring design freedom than was previously possible, and in which through hole connections are reduced. Other objects of the invention are to provide a multilayer printed circuit board useful for achieving SMT component mounting and PIH component mounting.

SUMMARY OF THE INVENTION

The above objects are achieved, in accordance with the invention, by providing a multilayer printed circuit board in which power conductors or ground conductors are electrically connected using through holes. On the other hand, signal conductors in any two adjacent signal wiring layers are electrically connected using via holes extending only through an intervening electrically insulating layer. Preferably, the electrically insulating layer is a layer of photosensitive resin and the via holes are formed using conventional photolithographic techniques.

In a first embodiment of the inventive multilayer printed circuit board, a region of electrically conductive material, e.g., copper, overlies, i.e., lies on or over, a surface of an electrically insulating substrate. This region of electrically conductive material is, for example, a layer of electrically conductive material, lying on the electrically insulating substrate, which serves as a power supply layer or ground layer. Two or more signal wiring layers, separated by an electrically insulating layer, overlie the opposite surface of the electrically insulating substrate. The outermost signal wiring layer includes an electrical conductor which serves as a power conductor or ground conductor. A through hole, containing electrically conductive material, serves to electrically connect the power conductor or ground conductor to the power supply layer or ground layer. In addition, one or more via holes, extending only through the electrically insulating layer and containing electrically conductive material, serve to electrically connect two or more signal conductors in the adjacent signal wiring layers.

In a second embodiment of the inventive multilayer printed circuit board, two or more signal wiring layers, separated by electrically insulating layers, overlie each surface of the electrically insulating substrate. The outermost signal wiring layers include power or ground conductors which are electrically connected by a through hole containing electrically conductive material. As before, signal conductors in adjacent signal wiring layers are electrically connected by via holes extending through the intervening electrically insulating layers and containing electrically conductive material.

It should be noted that SMT components are readily mounted on (appropriately dimensioned and configured) signal conductors, which serve as mounting terminals, in the outermost wiring layers of the first and second embodiments. In addition, PIH components are readily mounted in the through holes employed in the two embodiments.

BRIEF DESCRIPTION OF THE DRAWINGS

The invention is described with reference to the accompanying drawings, wherein:

FIGS. 2A–2I depict the steps involved in fabricating a second embodiment of the inventive multilayer printed circuit board.

DETAILED DESCRIPTION OF THE PREFERRED EMBODIMENTS

FIGS. 1A–1J depict the fabrication of a first embodiment of the inventive multilayer printed circuit board, which first embodiment is, for example, a four-layer printed circuit board.

Figure 1A:
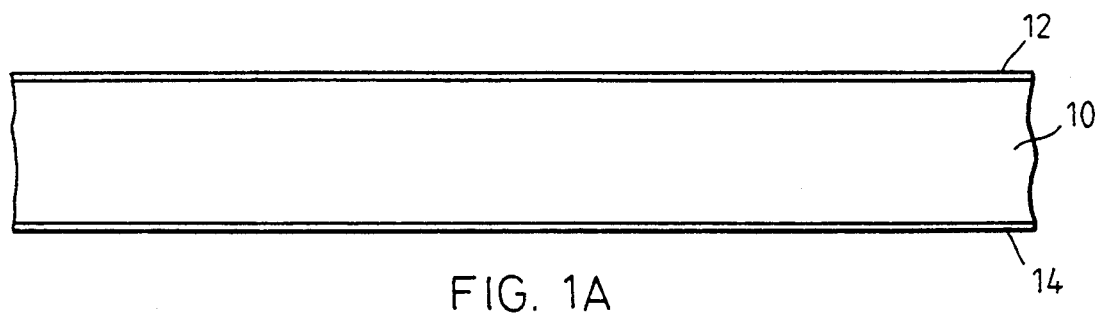
FIGS. 1A–1J depict the steps involved in fabricating a first embodiment of the inventive multilayer printed circuit board.

Referring now to FIG. 1A, there is shown an electrically insulating substrate 10, e.g., a glass epoxy substrate, both sides of which are laminated with layers 12 and 14 of electrically conductive material, e.g., copper. Each of the layers 12 and 14 has a weight of, for example, 0.5 ounces and a thickness of, for example, 18 micrometers.

Figure 1B:
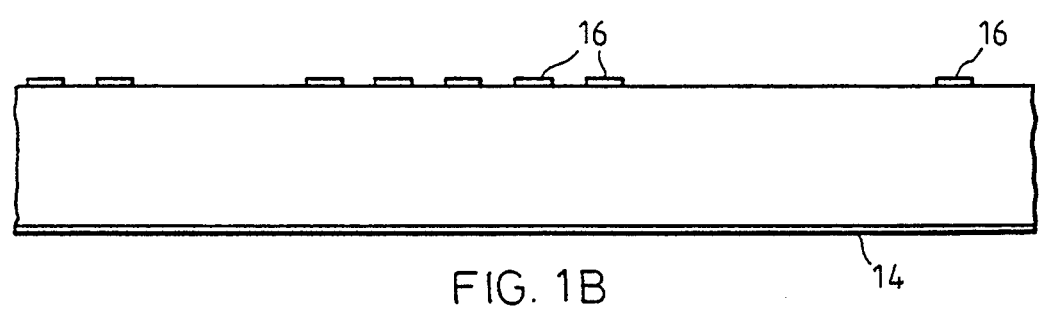

As shown in FIG. 1B, in fabricating the first embodiment, the copper layer 12 on one side is patterned by conventional selective etching to form a first wiring layer or wiring level which includes signal wiring conductors 16. The copper layer 14 on the other side is used as a power supply layer in this embodiment.

Figure 1C:
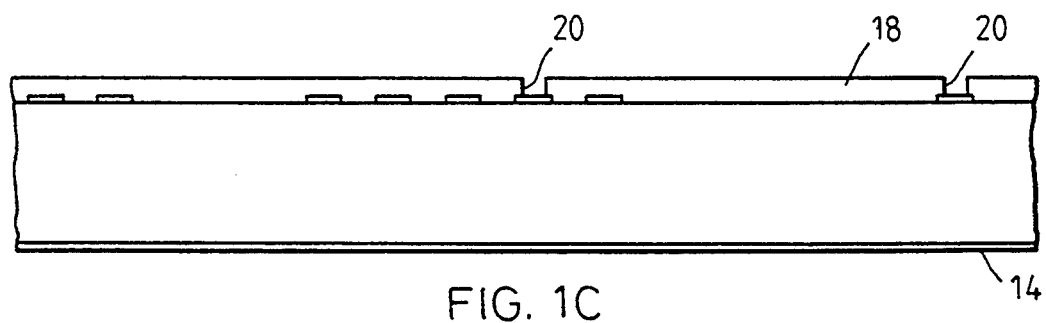

Next, in FIG. 1C, a layer 18 of electrically insulating material, preferably a layer of photosensitive resin, is applied to cover the signal wiring conductors 16 in the first wiring layer, and the photosensitive resin is then exposed and developed to form via holes 20 at selected locations. The photosensitive resin insulating layer used in a reduction to practice of the invention was Probimer 52, a negative type photosensitive epoxy resin marketed by Ciba-Geigy Ltd. This epoxy resin was applied to the surface of the substrate by curtain coating, and was then precured at 80° C. for one hour, then exposed with a mercury lamp, then developed with developer DY90 (a mixture of propylene carbonate, cyclohexanone, and gamma-butyrolactone) also marketed by Ciba-Geigy Ltd.

After being developed, the surface of the epoxy resin layer 18 was roughened by etching with a solution of potassium permanganate, and was then activated with Activator 180, a seeding chemical marketed by DYNA-CHEM Inc. This seeding chemical is a solution including colloidal tin and palladium.

Figure 1D:
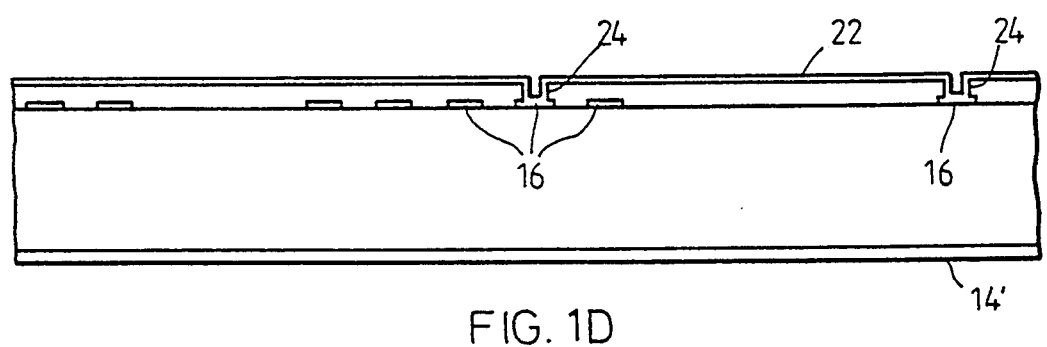

As shown in FIG. 1D, a layer 22 of electrically conductive material, e.g., copper, of second level is deposited by electroless plating on the entire surface of the insulating layer 18 formed with via holes. The copper layer 22 of the second level is connected to the signal wiring conductors 16 of the first level by plated via holes 24. The copper deposited by the electroless plating is also deposited on the lower copper layer 14 in FIG. 1C and thus thickens the copper layer 14 a little. The lower copper layer thus thickened is indicated by reference number 14' in FIG. 1D. The copper layer may be further thickened by electroplating after the electroless plating, if necessary.

Figure 1E:
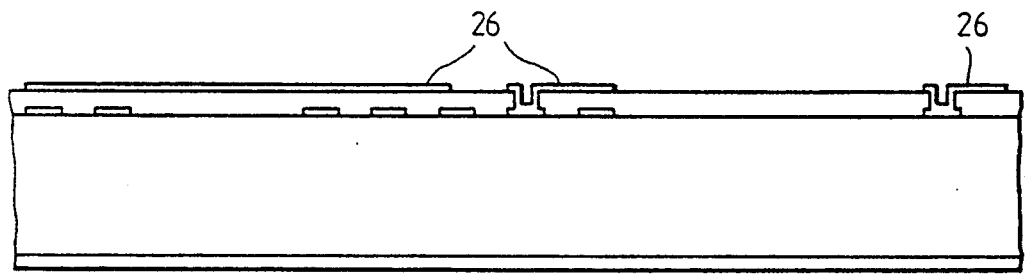

In FIG. 1E, the copper layer 22 is patterned by selective etching to form a second wiring layer or wiring level which includes signal wiring conductors 26.

Figure 1F:
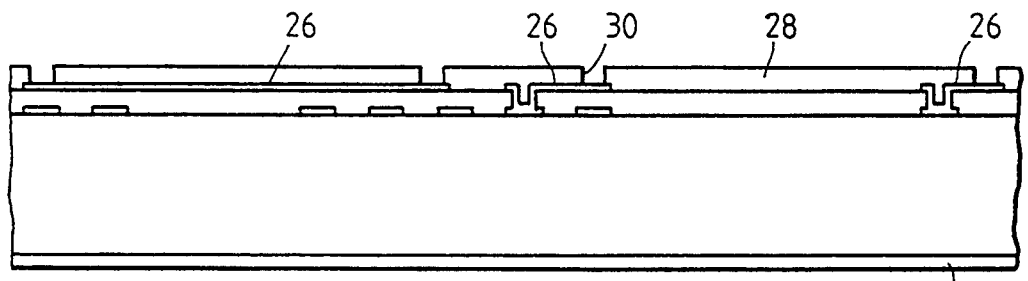

As shown in FIG. 1F, in the same manner as the step shown in FIG. 1C, a second photosensitive resin insulating layer 28 is applied on the signal wiring conductors 26 in the second level, and via holes 30 are formed at selected locations by exposure and development.

Figure 1G:
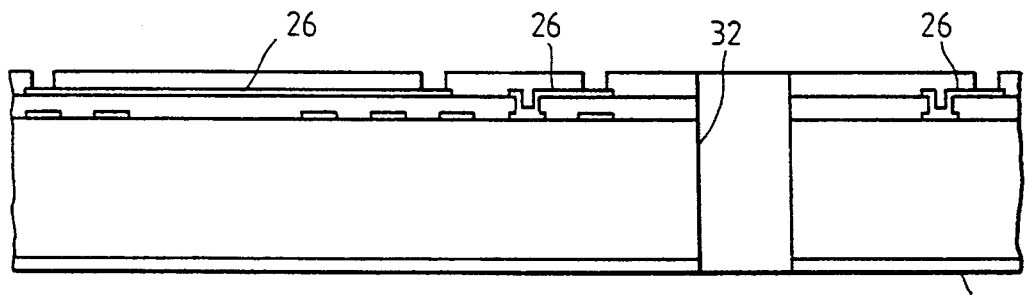

As shown in FIG. 1G, a through hole 32 is formed by drilling, e.g., mechanical drilling, at a location where a power supply connection is to be established. Although only one through hole 32 is shown in FIG. 1G, a plurality of through holes may be provided as required. The through hole 32 is used to provide a power supply connection from the power supply layer on the lower side of the circuit board to a power supply conductor or power supply pad on the upper side of the circuit board.

Figure 1H:
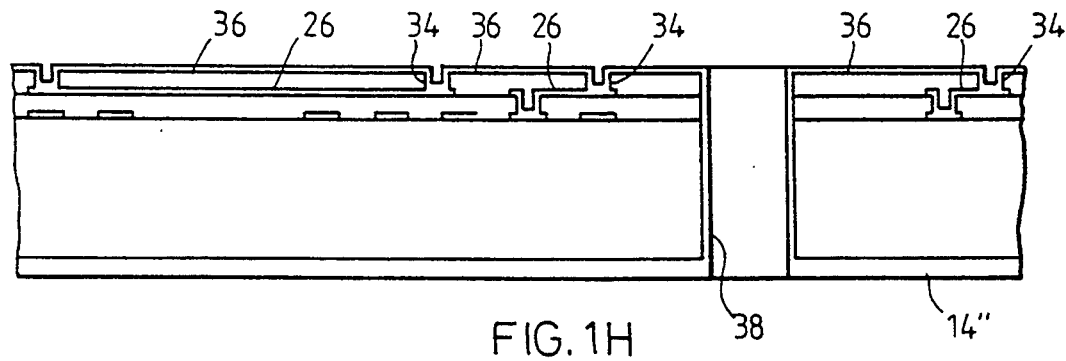

As shown in FIG. 1H, in the same manner as the step shown in FIG. 1D, copper is deposited by electroless plating on the entire surface inclusive of the through hole 32. The copper is also deposited on the lower copper layer 14' shown in FIG. 1G and thus thickens the lower copper layer 14'. The lower copper layer thus thickened is indicated by reference number 14" in FIG. 1H. The deposited copper layer may be further thickened by electroplating after the electroless plating, if necessary. On the upper surface of the circuit board, there is formed a surface conductor layer 36, which is connected through the vias 34 to the signal wiring conductors 26 in the second level. A through hole connection 38 is formed in the through hole 32, which connects the upper surface and the lower surface of the circuit board.

Figure 1I:
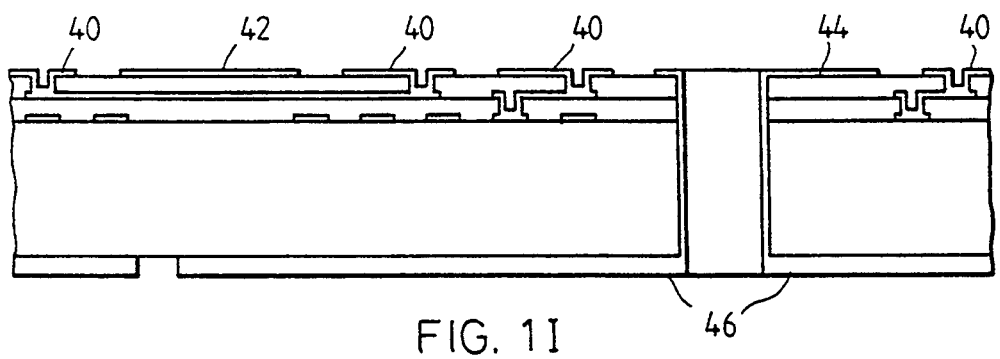

As shown in FIG. 1I, the surface conductor layer 36 and the lower copper layer 14" are patterned by selective etching to form signal wiring conductors 40 of third wiring level, a ground conductor 42 on the upper surface, a power supply conductor or power supply land 44 on the upper surface, and a power supply conductor 46 on the lower surface. The signal wiring conductors 40 on the upper surface provide SMT component mounting terminals. The lower copper layer 14" in FIG. 1H may be patterned as necessary when such components as resistors and capacitors are to be mounted on the lower side of the substrate for supply voltage regulation, decoupling and so on.

Figure 1J:
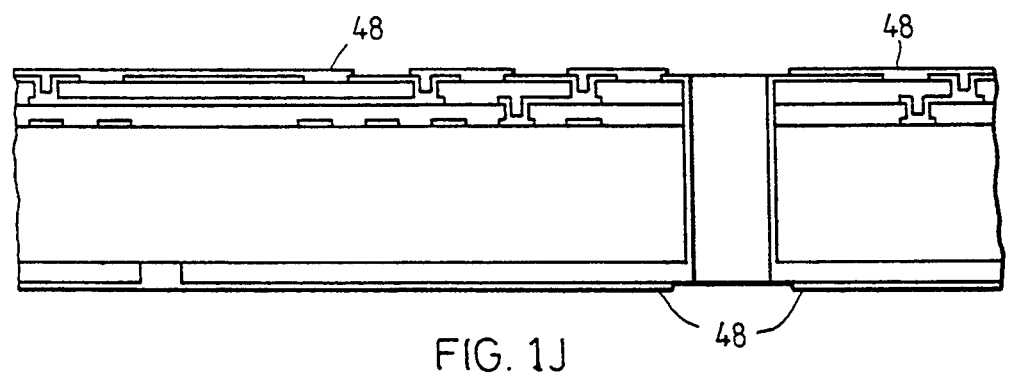

Finally, if so desired, and as shown in FIG. 1J, the conductor areas not to be exposed to solder are covered with solder masking layers 48 of a polyamide or epoxy resin and the through hole filled with solder using conventional wave soldering techniques. Prior to wave soldering, or even in the absence of wave soldering, a PIH component is readily mounted on the circuit board by inserting the pin or pins of the component into the through hole or through holes of the circuit board.

In the above-mentioned embodiment, the copper layer 14 on the lower surface of the insulating substrate is used as a power supply layer. However, the copper layer 14 may be used as a ground layer and the copper layer 42 on the upper surface of the circuit board may be used as a power supply layer. The electrical characteristics are almost the same in both cases.

Although a four-layer printed circuit board has been illustrated in the above, it is also possible to manufacture a printed circuit board of still more wiring layers by repeating similar steps.

FIGS. 2A to 2I depict the fabrication of a second embodiment of the inventive multilayer printed circuit board in which wiring layers are stacked on both sides of an insulating substrate. The fabrication process is basically the same as that shown in FIGS. 1A to 1I, except that wiring layers are formed as well on the lower side of the substrate 10. The elements on the lower side of the substrate corresponding to those formed on the upper side of the substrate are designated by reference numbers with primes attached to the reference numbers for the elements on the upper side of the substrate.

Figure 2A:
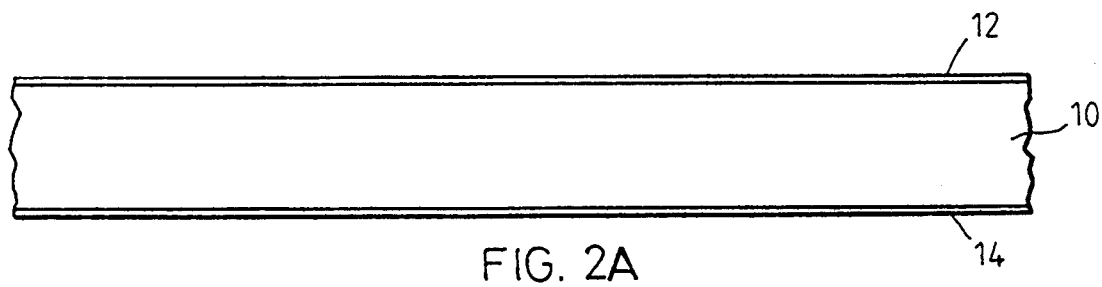
Figure 2B:
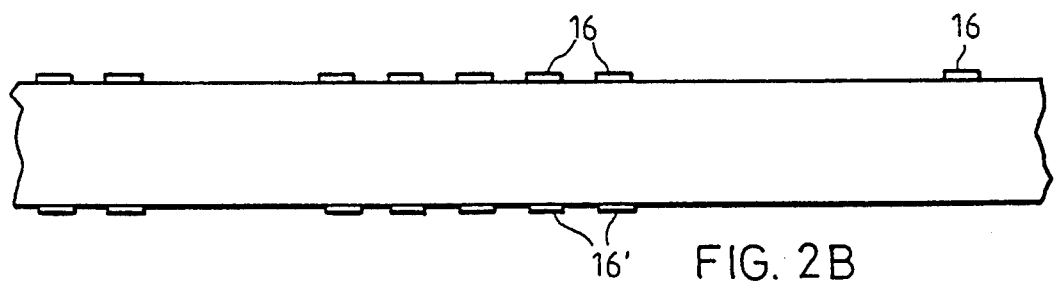
Figure 2C:
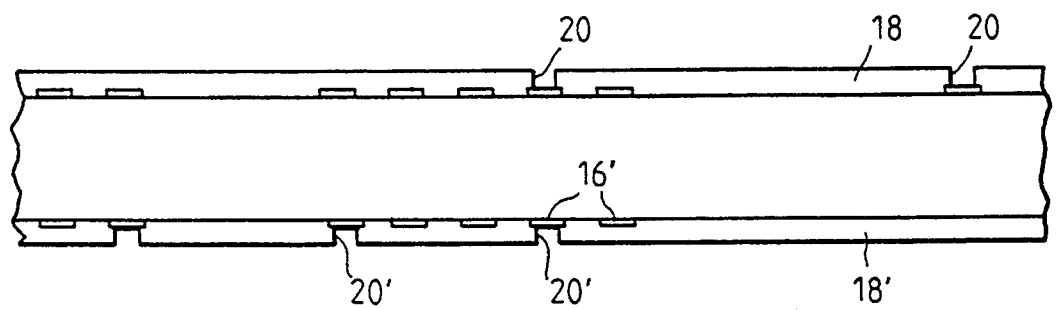
Figure 2D:
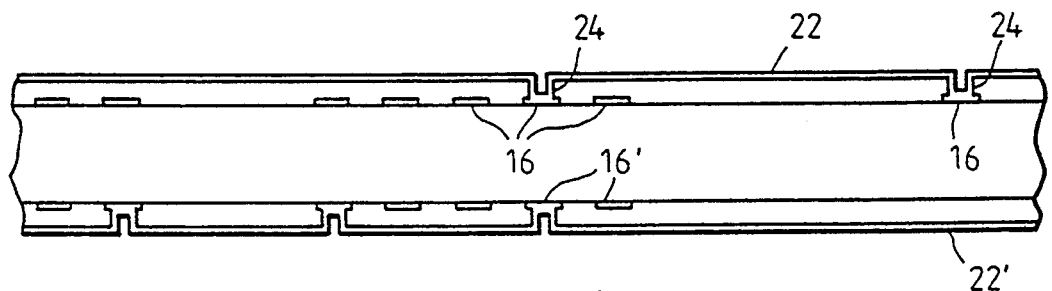
Figure 2E:
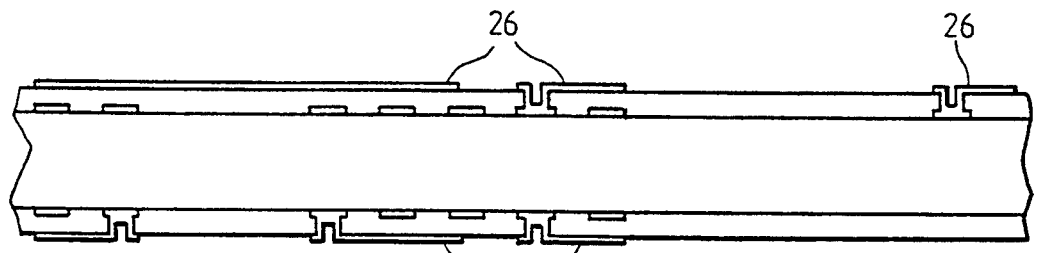
Figure 2F:
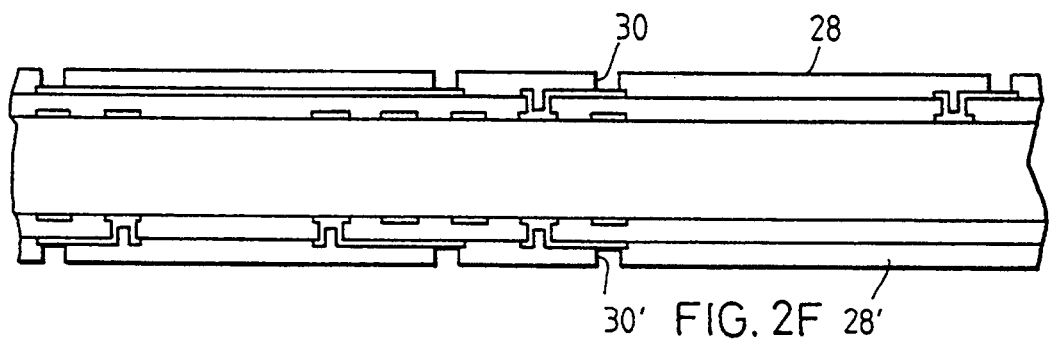
Figure 2G:
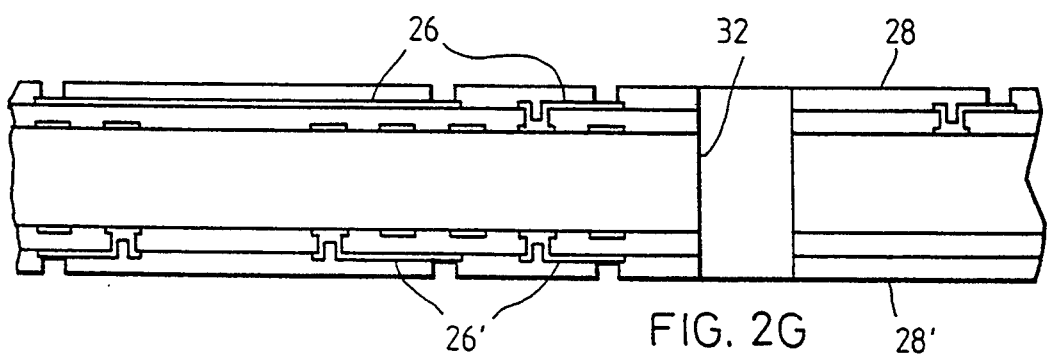
Figure 2H:
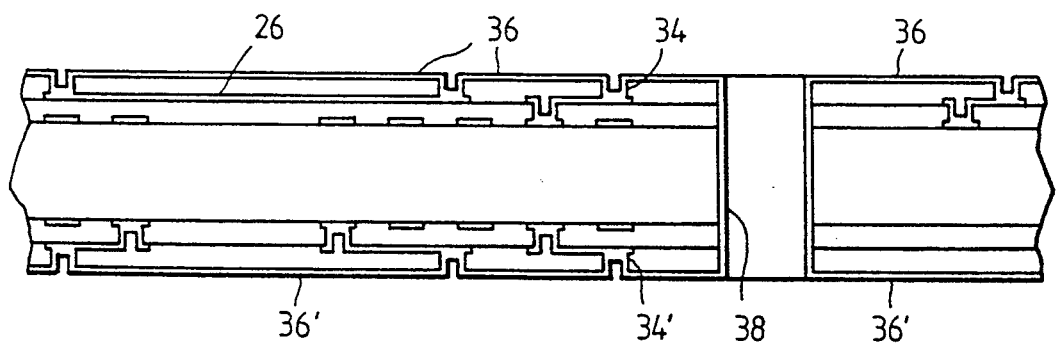
Figure 21:
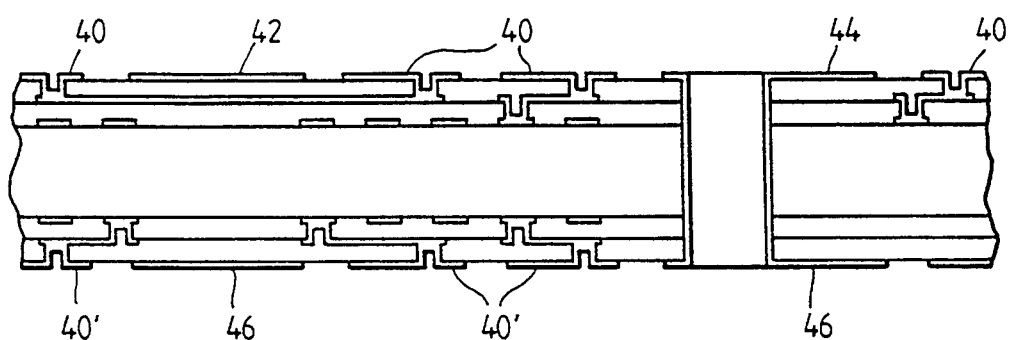

With regard to FIG. 2, both the upper copper layer 12 and the lower copper layer 14 are patterned as shown in FIG. 2B and are used as signal wiring layers. The subsequent steps are similar to those described with regard to FIGS. 1C to 1I. A through hole 32 is formed as shown in FIG. 2G. The entire surface is then deposited with copper by electroless plating as shown in FIG. 2H. As shown in FIG. 2I, the surface conductor layers 36 and 36' are etched to desired patterns. As shown in FIG. 2I, on the upper side of the circuit board there are formed a power supply conductor or power supply land 44 connected to a lower power supply layer 46 through a plated through hole 38, signal wiring conductors 40 and a ground layer 42. Also, the power supply layer 46 and signal wiring conductors 40' are formed on the lower side of the circuit board. The signal wiring conductors 40 and 40' may be used as SMT component mounting terminals.

With regard to FIG. 2 as well, the conductor layer 42 may be used as a power supply layer and the conductor layer 46 may be used as a ground layer.

The circuit board shown in FIG. 2I has no ground layer on its lower side. Hence, when a component which requires a ground connection is mounted on the lower side of the circuit board, it is sufficient to provide on the lower side of the circuit board a ground land (not illustrated) similar to the power supply land 44, and to provide another through hole through which to connect the ground layer 42 on the upper side of the circuit board to the ground land on the lower side. Needless to say, the ground land may be formed by the patterning used in FIG. 2I at the same time as the other conductor patterns on the surfaces of the circuit board.

The present invention has the following advantages:

(1) Because interconnection between signal layers is made through small via holes formed by photoprocessing and the use of larger through holes is minimized, the signal wiring density of the four-layer printed circuit board shown in FIG. 1 can be increased to about twice as much as that of conventional four-layer printed circuit board of the through hole connection type, with the result of greatly reduced circuit package size.

(2) Because through hole connections for signal wiring conductors are reduced, parasitic inductances and capacitances of signal wires are notably decreased, and the performance of multilayer printed circuit boards is improved.

(3) Because signal wiring can be designed substantially without regard to through hole connections, the degree of freedom for signal wiring design is increased such that design is facilitated and wiring design time can be shortened.

(4) Because the surface regions of a printed circuit board with no signal wiring conductors formed are covered with a power supply layer or ground layer, a higher shielding effect can be obtained.

(5) The present invention can be very economically implemented by utilizing existing processes and materials.

(6) The present invention can be applied not only to SMT component mounting but also to PIH component mounting.

We claim:

1. A multilayer printed circuit board, comprising:
   an electrically insulating substrate, including first and second surfaces;
   a first electrically conductive region, overlying said first surface of said electrically insulating substrate, to which electrical power or a ground potential is to be applied;
   at least first and second wiring layers, separated by an electrically insulating layer, overlying said second surface of said electrically insulating substrate, said first and second wiring layers including at least, respectively, first and second signal wiring conductors which are electrically connected to each other through a via hole, containing electrically conductive material, extending through said electrically insulating layer, there being no through hole electrical connections between said signal wiring conductors overlying said second surface and electrical conductors overlying said first surface, said second wiring layer, which overlies said first wiring layer, also including a second electrically conductive region intended to be electrically connected to said first electrically conductive region; and
   a through hole, containing electrically conductive material, extending through said first electrically conductive region, said electrically insulating substrate, said first wiring layer, said electrically insulating layer, and said second wiring layer, said electrically conductive material in said through hole serving to electrically connect said first electrically conductive region to said second electrically conductive region.

2. The multilayer printed circuit board of claim 1, wherein said first electrically conductive region is a power supply layer and said second electrically conductive region is a power supply conductor.

3. The multilayer printed circuit board of claim 2, wherein said second wiring layer also includes a ground conductor.

4. The multilayer printed circuit board of claim 1, wherein said first electrically conductive region is a ground layer and said second electrically conductive region is a ground conductor.

5. The multilayer printed circuit board of claim 4, wherein said second wiring layer also includes a power supply conductor.

6. The multilayer printed circuit board of claim 1, wherein said electrically insulating substrate is a glass-epoxy substrate.

7. The multilayer printed circuit board of claim 1, wherein said electrically insulating layer is a layer of photosensitive resin.

8. The multilayer printed circuit board of claim 1, wherein said second wiring layer also includes terminals for attachment of surface mount components.

9. A multilayer printed circuit board, comprising:
   an electrically insulating substrate, including first and second surfaces;
   at least first and second wiring layers, separated by a first electrically insulating layer, overlying said first surface, said first and second wiring layers including at least, respectively, first and second signal wiring conductors which are electrically connected to each other through a first via hole, containing electrically conductive material, extending through said first electrically insulating layer, said first wiring layer, which overlies said second wiring layer, also including a first electrically conductive region to which electrical power or a ground potential is to be applied;
   at least third and fourth wiring layers, separated by a second electrically insulating layer, overlying said second surface, said third and fourth wiring layers including at least, respectively, third and fourth signal wiring conductors which are electrically connected to each other through a second via hole, containing electrically conductive material, extending through said second electrically insulating layer, there being no through hole electrical connections between signal wiring conductors overlying said second surface and signal wiring conductors overlying said first surface, said fourth wiring layer, which overlies said third wiring layer, also including a second electrically conductive region intended to be electrically connected to said first electrically conductive region; and
   a through hole, containing electrically conductive material, extending through said first wiring layer, said first electrically insulating layer, said second wiring layer, said electrically insulating substrate, said third wiring layer, said second electrically insulating layer and said fourth wiring layer, said electrically conductive material in said through hole serving to electrically connect said first electrically conductive region to said second electrically conductive region.

10. The multilayer printed circuit board of claim 9, wherein said first and second electrically conductive regions are power supply conductors.

11. The multilayer printed circuit board of claim 10, wherein at least said first or said fourth wiring layer includes a ground conductor.

12. The multilayer printed circuit board of claim 9, wherein said first and second electrically conductive regions are ground conductors.

13. The multilayer printed circuit board of claim 12, wherein at least said first or said fourth wiring layer includes a power supply conductor.

14. The multilayer printed circuit board of claim 9, wherein said electrically insulating substrate is a glass-epoxy substrate.

15. The multilayer printed circuit board of claim 9, wherein said first and second electrically insulating layers are layers of photosensitive resin.

16. The multilayer printed circuit board of claim 9, wherein at least said first or said fourth wiring layer includes terminals for attachment of surface mount components.

* * * * *